United States Patent
Naghshineh et al.

(10) Patent No.: US 6,492,308 B1
(45) Date of Patent: *Dec. 10, 2002

(54) POST CHEMICAL-MECHANICAL PLANARIZATION (CMP) CLEANING COMPOSITION

(75) Inventors: Shahriar Naghshineh, Allentown, PA (US); Jeff Barnes, Bath, PA (US); Dingying Xu, Bethlehem, PA (US)

(73) Assignee: ESC, Inc., Bethlehem, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/587,883

(22) Filed: Jun. 6, 2000

Related U.S. Application Data

(63) Continuation-in-part of application No. 09/440,917, filed on Nov. 16, 1999, now Pat. No. 6,194,366.

(51) Int. Cl.$^7$ .............................. C11D 1/62; C11D 3/30; C11D 3/43

(52) U.S. Cl. ................. 510/175; 510/176; 510/245; 510/254; 510/499; 510/477; 510/488; 510/504

(58) Field of Search ................ 510/175, 176, 510/178, 245, 254, 499, 477, 504, 488; 134/1.2, 1.3, 41

(56) References Cited

U.S. PATENT DOCUMENTS

| | | | | |
|---|---|---|---|---|
| 5,466,389 A | * | 11/1995 | Ilardi et al. | 252/56 |
| 5,567,574 A | * | 10/1996 | Hasemi et al. | 430/331 |
| 5,580,846 A | * | 12/1996 | Hayashida et al. | 510/175 |
| 5,989,353 A | * | 11/1999 | Skee et al. | 134/2 |
| 5,997,658 A | * | 12/1999 | Peters et al. | 134/38 |
| 6,030,932 A | * | 2/2000 | Leon et al. | 510/175 |
| 6,060,439 A | * | 5/2000 | Doyel et al. | 510/164 |
| 6,152,148 A | * | 11/2000 | George et al. | 134/2 |
| 6,191,086 B1 | * | 2/2001 | Leon et al. | 510/175 |
| 6,194,366 B1 | * | 2/2001 | Nagashineh et al. | 510/175 |

FOREIGN PATENT DOCUMENTS

| | | |
|---|---|---|
| EP | 07 028254 | 1/1995 |
| EP | 647884 * | 4/1995 |
| EP | 0 690 483 A2 | 1/1996 |
| EP | 0 723 205 A1 | 7/1996 |
| EP | 1 031 884 A2 | 8/2000 |
| EP | 1 128 221 A2 | 8/2001 |
| WO | WO 94/08276 | 4/1994 |
| WO | WO 98/16330 | 4/1998 |

* cited by examiner

Primary Examiner—Gregory Delcotto
(74) Attorney, Agent, or Firm—RatnerPrestia

(57) ABSTRACT

A cleaning solution for cleaning microelectronic substrates, particularly for post-CMP or via formation cleaning. The cleaning solution comprises a quaternary ammonium hydroxide, an organic amine, a corrosion inhibitor, and water. A preferred cleaning solution comprises tetramethylammonium hydroxide, monoethylanolamine, ascorbic acid, and water with the alkalinity of the cleaning solution greater than 0.073 milliequivalents base per gram of solution.

7 Claims, 14 Drawing Sheets

Image Statistics
Img. Z range 25.653 nm
Img. Mean -0.000001 nm
Img. Raw mean -0.723 nm
Img. Rms (Rq) 0.785 nm
Img. Ra 0.571

Box Statistics

Z range
Mean
Raw mean
Rms (Rq)
Mean roughness (Ra)
Box x dimension
Box y dimension Image Statistics
Img. Z range    45.165 nm
Img. Mean       -0.000001 nm
Img. Raw mean   3.821 nm
Img. Rms (Rq)   3.815 nm
Img. Ra         2.733

Box Statistics
Z range
Mean
Raw mean
Rms (Rq)
Mean roughness (Ra)
Box x dimension
Box y dimension

POST CHEMICAL-MECHANICAL PLANARIZATION (CMP) CLEANING COMPOSITION

CROSS REFERENCE TO RELATED APPLICATIONS

This application is a continuation-in-part of U.S. patent application Ser. No. 09/440,917 filed Nov. 16, 1999, now U.S. Pat. No. 6,194,366.

STATEMENT REGARDING FEDERALLY SPONSORED RESEARCH OR DEVELOPMENT

Not applicable

FIELD OF THE INVENTION

The present invention relates generally to the field of post chemical-mechanical polishing (post-CMP) cleaning operations, and more specifically to post-CMP cleaning solutions for microelectronic substrates.

BACKGROUND OF THE INVENTION

The present day fabrication of semiconductor devices is a complex, multi-step process The chemical-mechanical planarization (CMP) process is now a well-established enabling technology used by most advanced semiconductor operation for planarization of various substrates for production of devices with design geometries of less than 0.35 micron.

The CMP processes involve holding and rotating a thin, flat substrate of the semiconductor material against a wetted polishing surface under controlled chemical, pressure and temperature conditions. A chemical slurry containing a polishing agent, such as alumina or silica, is used as the abrasive material. In addition, the chemical slurry contains selected chemicals, which etch various surfaces of the substrate during processing. The combination of mechanical and chemical removal of material during polishing results in superior planarization of the surface.

The CMP process, however, leaves contamination on the surfaces of the semiconductor substrate. This contamination is comprised of abrasive particles from the polishing slurry which may consist of alumina or silica with reactive chemicals added to the polishing slurry. In addition, the contaminant layer may comprise reaction products of the polishing slurry and the polished surfaces. It is necessary to remove the contamination prior to subsequent processing of the semiconductor substrate in order to avoid degradation in device reliability and to avoid the introduction of defects which reduce the manufacturing process yield. Thus, post-CMP cleaning solutions have been developed to cleanse the substrate surface of CMP residuum.

Alkaline solutions based on ammonium hydroxide have been traditionally used in post-CMP cleaning applications. To date, most CMP applications have been directed to aluminum, tungsten, tantalum, and oxide-containing surfaces.

However, copper is increasingly becoming a material of choice in the production of interconnects in semiconductor fabrication. Copper is replacing aluminum as the metal of choice in such fabrication. Conventional post-CMP processes are inadequate for cleaning surfaces containing copper. Copper, copper oxides, and the slurry particles are the contaminants that exist on the copper surface following this CMP process. The copper surface diffuses quickly in silicon and silicon dioxide. Therefore, it must be removed from all wafer surfaces to prevent device failure.

Post-CMP cleaning solution that is traditionally effective on alumina and silica-based CMP processes are not effective on copper-containing surfaces. Copper is easily damaged by these cleaning solutions. In addition, cleaning efficacy with the present post-CMP cleaning solutions has been proven unacceptable.

Nam, U.S. Pat. No. 5,863,344, discloses a cleaning solution for semiconductor devices containing tetramethyl ammonium hydroxide, acetic acid, and water. The solution preferably contains a volumetric ratio of acetic acid to tetramethyl ammonium hydroxide ranging from about 1 to about 50.

Ward, U.S. Pat. No. 5,597,420, discloses an aqueous stripping composition useful for cleaning organic and inorganic compounds from a substrate that will not corrode or dissolve metal circuitry in the substrate. The disclosed aqueous composition contains preferably 70 to 95 wt % monoethanolamine and a corrosion inhibitor at about 5 wt % such as catechol, pyrogallol or gallic acid.

Ward, U.S. Pat. No. 5,709,756, discloses a cleaning composition containing about 25 to 48 wt % hydroxylamine, 1 to 20 wt % ammonium fluoride, and water. The pH of the solution is greater that 8. The solution may further contain a corrosion inhibitor such as gallic acid, catechol, or pyrogallol.

Hardi et al., U.S. Pat. No. 5,466,389, discloses an aqueous alkaline cleaning solution for cleaning microelectronic substrates. The cleaning solution contains a metal ion-free alkaline component such as a quaternary ammonium hydroxide (up to 25 wt %), a nonionic surfactant (up to 5 wt %), and a pH-adjusting component, such as acetic acid, to control the pH within the range of 8 to 10.

Schwartzkopf et al., European Patent No. 0647884A1 discloses photoresist strippers containing reducing agents to reduce metal corrosion. This patent teaches the use of ascorbic acid, gallic acid pyrogallol among others for the control of metal corrosion in alkali containing components.

U.S. Pat. No. 5,143,648 to Satoh et al., which is herein incorporated by reference, discloses novel ascorbic acid derivatives as antioxidants.

Ward U.S. Pat. No. 5,563,119 discloses an aqueous stripping composition consisting of an alkanolamine, tetraalkylammonium hydroxide, and a corrosion inhibitor for cleaning organic residue from aluminized inorganic substrates.

There is a need for a post-CMP cleaning composition for copper-containing surfaces. Such a post-CMP cleaning composition must effectuate substantial particle removal from the target surface and prevent corrosion of the copper-containing substrate. Such a post-CMP cleaning composition must also refrain from attacking the process equipment used in the post-CMP process. Such a post-CMP cleaning composition should also be economical, work effectively through a wide temperature range. Such a post-CMP cleaning composition should also be useful in cleaning operations following CMP processes utilizing alumina or silica-based slurries.

SUMMARY OF THE INVENTION

The present invention is an aqueous cleaning solution for cleaning microelectronic substrates comprising a quaternary ammonium hydroxide selected from the group consisting of tetraalkylammonium hydroxide, wherein the alkyl contains one of $C_1$ through $C_{10}$ atoms or combination of $C_1$ through $C_{10}$ atoms; an organic amine selected from the group consisting of monoethanolamine, aminoethylethanolamine, N-methylaminoethanol, aminoethoxyethanol, diethanolamine, triethanolamine, $C_2$–$C_5$ alkanolamines, and combinations thereof; a corrosion inhibitor selected from the group consisting of ascorbic acid, L(+)-ascorbic acid, isoascorbic acid, ascorbic acid derivatives, citric acid, ethylenediamine, tetnaacetitic acid (EDTA), benzotriazole, and combinations thereof The alkalinity of the solution is greater than 0.073 milliequivalents base per gram of solution.

Thus in one aspect the present invention is a cleaning solution for cleaning microelectornic substrates, the cleaning solution comprising: 0.05 to 12.4 wt % quaternary ammonium hydroxide selected from the group consisting of tetraalkylammonium hydroxide, wherein the alkyl contains one of $C_1$ through $C_{10}$ atoms or combination of $C_1$ through $C_{10}$ atoms; 0.2 wt % to 27.8 wt % of a polar organic amine selected from the group consisting of monoethanolamine, aminoethylethanolamine, N-methylaminoethanol, aminoethoxyethanol, diethanolamine, triethanolamine, $C_2$–$C_5$ alkanolamines, and combinations thereof; an effective amount of a corrosion inhibitor selected from the group consisting of ascorbic acid (Vitamin C), L(+)-ascorbic acid, isoascorbic acid, ascorbic acid derivatives, benzotriazole, citric acid, ethylenediamine, tetraacetitic acid (EDTA), and combinations thereof balance water; and wherein the alkalinity of the solution is greater than 0.073 milliequivalents base per gram of solution.

In one aspect the present invention is a cleaning solution for cleaning microelectronic substrates comprising a) tetramethylammonium hydroxide, b) monoethanolamine, c) ascorbic acid, and deionized water. The alkalinity of the solution is greater than 0.073 milliequivalents base per gram of solution. Preferably, tetramethylammonium hydroxide is in the cleaning solution in an amount in the range from about 0.15 wt % to about 1.25 wt %, monoethanolamine is in the solution in an amount in the range from about 0.2 wt % to about 2.25 wt %, and ascorbic acid is in the solution in an amount in the range from about 0.10 wt % to about 0.9 wt %.

In still another aspect the present invention is a cleaning solution for microelectronic substrates, the cleaning solution consisting essentially of; from 1.5 wt % to 12.5 wt % of a concentrate consisting of 3.0 to 12.4 wt % quaternary ammonium hydroxide selected from the group consisting of tetraalkylammonium hydroxide wherein the alkyl contains one of $C_1$ through $C_{10}$ atoms or combination of $C_1$ through $C_{10}$ atoms, 5.0 wt % to 27.8 wt % of a polar organic amine selected from the group consisting of monoethanolamine, aminoethylethanolamine, N-methylaminoethanol, aminoethoxyethanol, diethanolamine, triethanolamine, $C_2$–$C_5$ alkanolamines, and mixture thereof; 2.0 wt % to 10.9 wt % corrosion inhibitor selected from the group consisting of ascorbic acid (Vitamin C), L(+)-ascorbic acid, isoascorbic acid, ascorbic acid derivatives, benzotriazole, citric acid, ethylenediamine, tetraacetitic acid (EDTA), and combinations thereof balance water; and, 87.5 wt % to 98.5 wt % deionized water, with the solution having an alkalinity greater than 0.073 milliequivalents base per gram of solution.

In yet another aspect the present invention is a concentrate composition for a cleaning solution for cleaning microelectronic substrates. The concentrate composition comprises from about 3.0 wt % to about 12.4 wt % tetramethylammonium hydroxide from about 5 wt % to about 27.8 wt % monoethanolamine, from about 2.0 wt % to about 10.4 wt % ascorbic acid, balance deionized water. A cleaning solution is made by either mixing from at least about 1.5 wt % to almost 100 wt % concentrate with deionized water. The concentrate can also be used without further mixing with water.

DETAILED DESCRIPTION OF THE INVENTION

Figure 1:
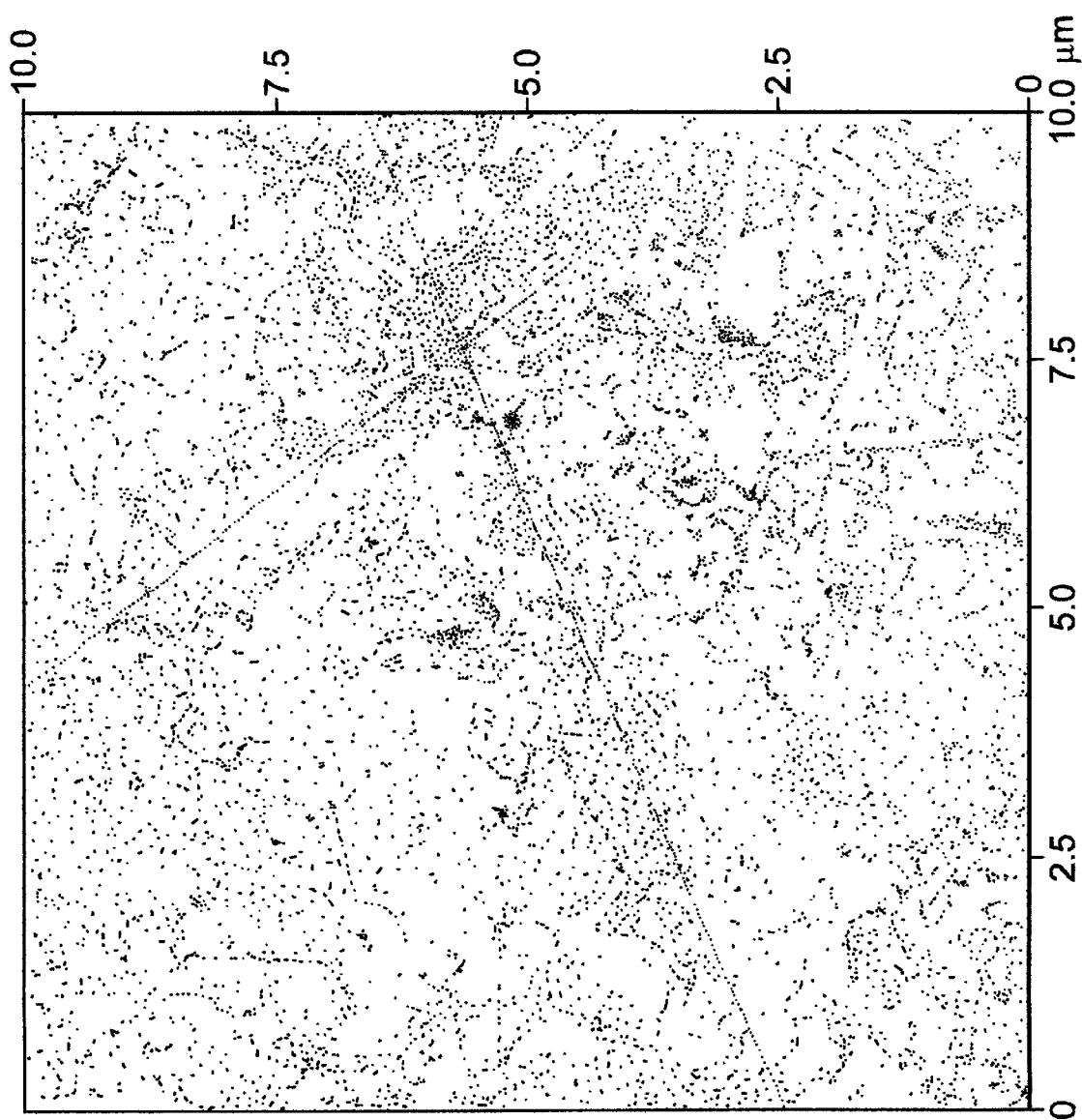
FIG. 1 is an atomic force microscopy (AFM) scan at 10 μm×10 μm magnification of the surface of partially polished electrochemically deposited copper on a substrate.

A cleaning solution for cleaning copper-containing microelectronic substrates following CMP processing is provided. Cleaning copper-containing substrates following CMP processing is generally referred to as "Post CMP copper clean". A "copper-containing microelectronic substrate" is understood herein to refer to a substrate surface manufactured for use in microelectronic, integrated circuit, or computer chip applications, wherein the substrate contains copper-containing components. Copper-containing components may include, for example, metallic interconnects that are predominately copper or a copper alloy. It is understood that the microelectronic surface may also be composed of semiconductor materials, such as TiN, Ta, TiW as copper diffusion barrier metals and silica. Generally, a copper-containing microelectronic substrate contains from about 1% to 100% Cu, including the copper interconnects.

The cleaning solution of the invention can be used for any cleaning operation during the fabrication of microelectronic substrates, such as semiconductor wafers. Most notably, such cleaning applications include post-Via formations and post-CMP processes. The fabrication of conventional semiconductor wafers entails many steps requiring planarization, followed by the removal of residual material from the planarization process.

The cleaning solution of the invention comprises a quaternary ammonium hydroxide, an organic amine, a corrosion inhibitor, and the balance water. The quanternary ammonium hydroxide is selected from the group consisting of tetraalkylammonium hydroxide (TMAH) where the alkyl contains one of $C_1$ through $C_{10}$ atoms or a combination of $C_1$ through $C_{10}$ atoms. Quaternary ammonium hydroxide is present in the solution in an amount from about 0.05 wt % to about 12.4 wt %.

The polar organic amine is selected from the group consisting of monoethanolamine (MEA), aminoethylethanolamine, N-methylaminoethanol, aminoethoxyethanol, diethanolamine, triethanolamine, $C_2$–$C_5$, alkanolamines, and combinations thereof. The polar organic amine is present in the solution in an amount from about 0.2 wt % to about 27.8 wt %.

The corrosion inhibitor is selected from the group consisting of ascorbic acid, L(+)-ascorbic acid, isoascorbic acid, ascorbic acid derivatives, citric acid, benzotriazole, and combinations thereof. Corrosion inhibitor is present in the solution in an amount from about 0.2 wt % to about 10.9 wt %. It is desirable to obtain the optimal amount of corrosion while effectively cleaning of the surface in such way that the copper oxides and other contamination are removed from the surface. Therefore, for optimal cleaning, the process usually induces a slight amount of copper loss at the wafer surface, but maintains the electrical properties of the wafer.

The alkalinity of a cleaning solution of the invention is greater than 0.073 milliequivalents base per gram of solution. In one embodiment of the invention, a concentrated composition is provided that can be diluted as a use for cleaning solution. A concentrated composition of the invention, or "concentrate", advantageously permits a user, e.g. CMP process engineer, to dilute the concentrate to the desired strength and alkalinity. A concentrate of the product has longer shelf life, is easier to ship and store.

Ascorbic acid and its derivatives have been used extensively as antioxidants in food and medicine. They have also been found to be successful corrosion inhibitors for metals or metal alloys existing in an aqueous or solvent environment. Ascorbic acid and other components of the invention are readily available commercially.

An important feature of the cleaning solution of the invention is that the non-aqueous constituents (the constituents other than water) are present in the solution in small quantities. This is an economic advantage since an effective cleaning solution can be formulated more economically, which is of importance since post-CMP cleaning solutions are used in large quantities.

A concentrate solution according to the invention preferably comprises from about 3.0 to 12.4 wt % TMAH from about 5.0 to about 27.8 wt % MEA from about 2.0 to about 10.4 wt % ascorbic acid, balance water (preferably deionized water).

Additionally, the concentrate of the invention can also contain a chelating agent for further prevention of deposition of undesirable metal contaminants on the wafer surfaces. Well-known metal complex agents for Zn, Cu, Ni, Fe, etc. were introduced in the formulation. It is also known that the metal protection capability of the corrosion inhibitors in many cases is associated with the complex forming properties of the organic complex-forming agents.

The concentrate of the invention is preferably diluted for use in post-CMP cleaning applications by adding deionized water until the concentrate is from about 1.5 wt % to about 12.5 wt % of the prepared cleaning solution. The cleaning solution of the invention may be employed for cleaning microelectronic substrates at temperatures ranging from ambient conditions to about 70° C. It is generally recognized that cleaning improves as temperature increases.

The cleaning solution of the invention, as noted, has an alkalinity greater than 0.073 milliequivalents base per gram of solution. More preferably, the alkalinity of a cleaning solution of the invention is maintained greater than about 0.091 milliequivalents base per gram of solution.

The cleaning solution of the invention meets generally accepted industry cleaning performance standards for post-CMP applications. A common industrial cleaning target is a particle count on the substrate wafer of less than 20 particles greater than 0.2 microns in size for a 200 mm wafer, with a 5 mm edge exclusion.

The cleaning solution of the invention does not require a surfactant in the formulation however this does not preclude their use in specific applications.

The cleaning solution of the invention may be used with a large variety of conventional cleaning tools, including Verteq single wafer megasonic Goldfinger, OnTrak systems DDS (double-sided scrubbers), SEZ single wafer spray rinse and Megasonic batch wet bench systems.

The cleaning solution of the invention may be used successfully on surfaces containing copper, tungsten, and/or silica.

As noted, via cleaning is one application for the cleaning solution of the invention. Vias are holes etched in microelectronic substrates to provide a conduit for connecting metal layers. Etching the substrate surface with a gaseous etchant forms Vias. The substrate is commonly a dielectric material, such as Fluorinated Silica Glass (FSG). The residue remaining on the substrate surface and Via walls must be removed following the etching process. The residue is often referred to as "side wall polymer", as it is also found on the vertical walls of the Via. Etching residue may also be located at the bottom of the Via, on top of the metal. The cleaning solution of the invention does not react with or affect the exposed dielectric material.

The following Examples are merely illustrative of the invention and are not intended to be limiting.

EXAMPLE 1

Tests were conducted to evaluate the relative cleaning performance of post-CMP cleaning solutions of varying compositions. Cleaning solutions were prepared by mixing deionized water TMAH, ascorbic acid and one of three amine compounds (MEA, hydroxylamine, or N-monoethanolamine). The composition of the prepared cleaning solutions is set forth in Table 1. For purposes of comparison, two additional cleaning solutions were prepared: Solution 10 was 1.7 wt % $NH_4OH$ in deionized water and Solution 11 was 1:2:10 $NH_4OH:H_2O_2:H_2O$.

"Dip tests" were conducted using pre-cleaned Fisher 12-550-10 glass microscope slides. In the following procedures, all dips were undertaken for 5 sec., and handled with plastic forceps. A sample slide was first dipped into a CMP oxide slurry (Ultraplane P-1500), then dipped into 250 ml of deionized water, and then into a W-CMP slurry (1:1 dilution of Ultraplane-MC W CMP base and deionized water). Each slide was then dipped into 250 ml deionized water, then into the subject cleaning solution. Each slide was then dipped into 100 ml deionized water, then dipped into another separate deionized water bath. The slides were hung to air dry under ambient conditions. Between each test, all deionized water baths were replaced.

Dried slides were visually evaluated for evidence of remaining CMP slurry, as evidenced by the degree of cloudiness observed on the slide. The dried slides were compared and ranked from best (1) to worst (11).

The results are shown in Table 1.

TABLE I
COMPARATIVE DIP TEST

| | Amine | TMAH (wt %) | Amine (wt %) | Ascorbic Acid (wt %) | Gallic Acid (wt %) | Titration Alkalinity Meq./gram of solution | Relative Rank |
|---|---|---|---|---|---|---|---|
| 1 | MEA | 0.5 | 0.9 | 0.2 | — | 0.191 | 1 |
| 2 | MEA | 0.5 | 0.9 | 0.35 | — | 0.182 | 2 |
| 3 | MEA | 0.5 | 0.9 | — | 0.35 | 0.182 | 3 |
| 4 | NMEA | 0.5 | 0.9 | — | 0.35 | 0.154 | 4 |
| 5 | MEA | 0.5 | 0.9 | — | 0.1 | 0.196 | 5 |
| 6 | HA | 0.66 | 0.3 | — | 0.233 | 0.235 | 6 |
| 7 | HA | 0.66 | 0.6 | — | 0.233 | 0.284 | 7 |
| 8 | HA | 0.33 | 0.3 | — | 0.467 | 0.122 | 8 |
| 9 | HA | 0.33 | 0.6 | — | 0.467 | 0.171 | 9 |
| 10 | — | — | — | — | — | 0.485 | 10 |
| 11 | — | — | — | — | — | NA | 11 |

The results indicate that preferred embodiments of the invention performed best (i.e. solutions 1 and 2). All solutions of the invention performed better than cleaning solutions of the prior art (solutions 10 and 11).

EXAMPLE 2

Cleaning solutions (A through G) were evaluated for the tendency to copper. Solution A consisted of 0.9 wt % MEA, 0.5 wt % TMAH and 0.35 ascorbic acid, balance deionized water. Solution B consisted of 0.9 wt % MEA, 0.5 wt % TMAH and 0.18 wt % (L)-ascorbic acid and the balance deionized water. Solution C consists of 0.9 wt % MEA in water. Solution D consists of 0.9 wt % MEA, 0.5 wt % TMAH and 0.35 wt % gallic acid and the balance water. Solution E consists of 0.9 wt % MEA, 0.5 wt % TMAH and 0.18 wt % gallic acid and 0.18 wt % benzotriazole and the balance water. Solution F was a buffered HF solution and solution G was 1.7 wt % NH$_4$OH in water solution. Copper strips of uniform length and width were obtained from an entire piece of electrochemically deposited (ECD) copper wafer (partially polished), then placed in 200 ml of the sample cleaning solution for 2 minutes with stirring under ambient conditions. The copper wafer strips were thereafter removed from the cleaning solution, rinsed with deionzed water, and nitrogen dried. The copper wafer strips were visually inspected for color changes and loss of gloss. Both are evidence of corrosion. These treated copper wafer strips were subjected to Atomic Force Microscopy (AFM) examination for surface corrosion.

The corrosion results are set forth in Table II.

TABLE II
Corrosion Test Data

| Composition | Substrate | Test Method | Results |
|---|---|---|---|
| | Cu (ECD, partially polished) | AFM | RMS = 0.8 slight pitting after polishing |
| Solution A | Cu (ECD, partially polished) | AFM | RMS = 1.0 minimal pitting minimal Cu attack |
| Solution B | Cu (ECD, partially polished) | AFM | RMS = 1.1 minimal pitting minimal Cu attack |
| Solution C | Cu (ECD, partially polished) | AFM | RMS = 3.4 slight pitting moderate Cu attack |
| Solution D | Cu (ECD, partially polished) | AFM | RMS = 3.5 slight pitting, moderate Cu attack |
| Solution E | Cu (ECD, partially polished) | AFM | RMS = NA surface modified by BTA |
| Solution F | Cu (ECD, partially polished) | AFM | RMS = 1.3 minimal pitting slight Cu attack |
| Solution G | Cu (ECD, partially polished) | AFM | RMS = 3.8 slight pitting, moderate Cu attack |

*RMS = root mean square roughness via AFM.

The data in Table II indicate a preferred embodiment of the invention (solution A) performed very well in terms of copper corrosion protection. Solutions A and B differ in the amount of corrosion inhibitor concentration. All other solutions caused a significant amount of corrosion of the copper surfaces as compared to the preferred embodiment. Solution G removes only the copper oxide layer on the surface therefore a slight roughening occurs.

Figure 2:
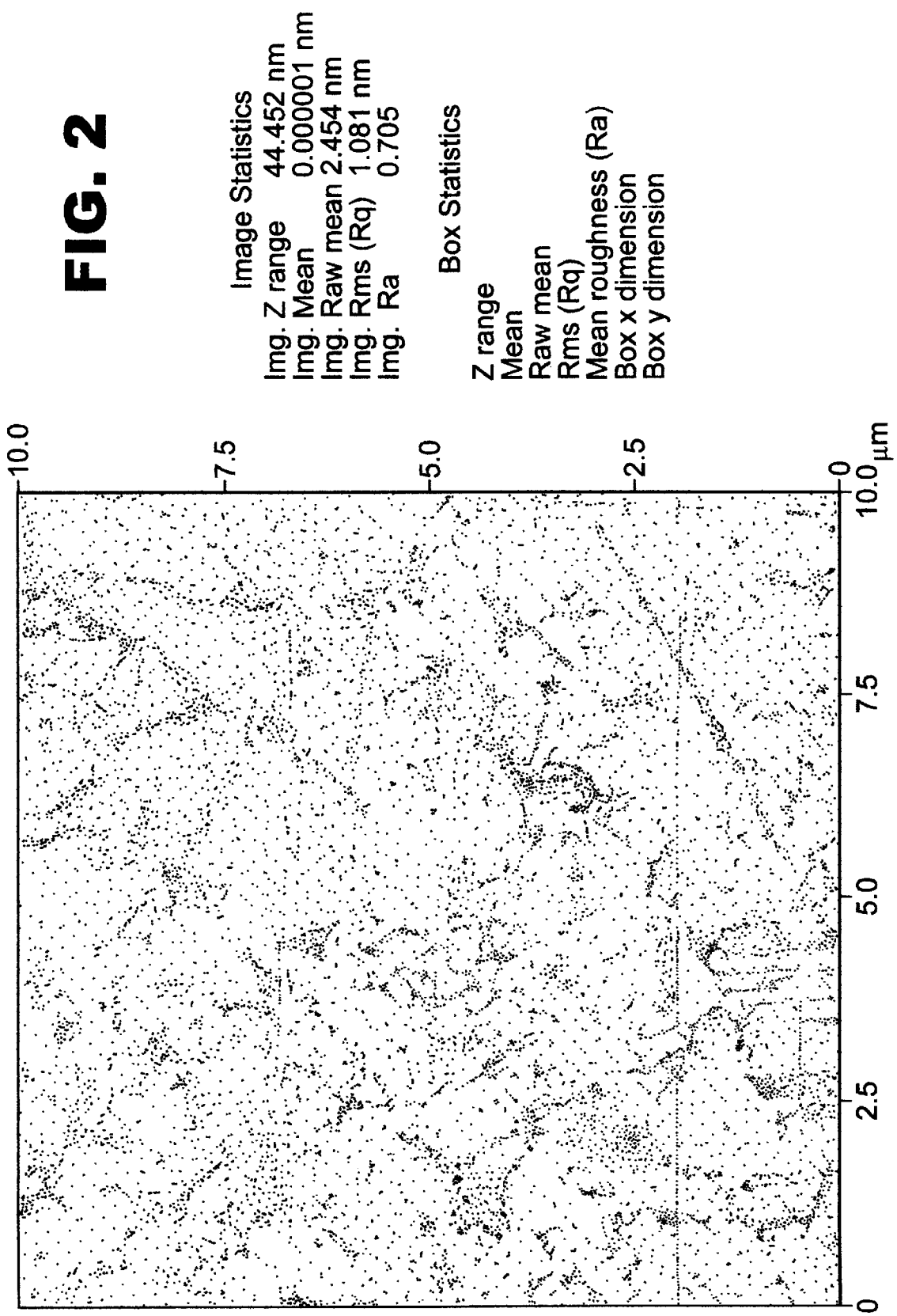
FIG. 2 is an atomic force microscopy (AFM) scan at 10 μm×10 μm magnification of the wafer of FIG. 1 treated with a solution according to the present invention.
Figure 3:
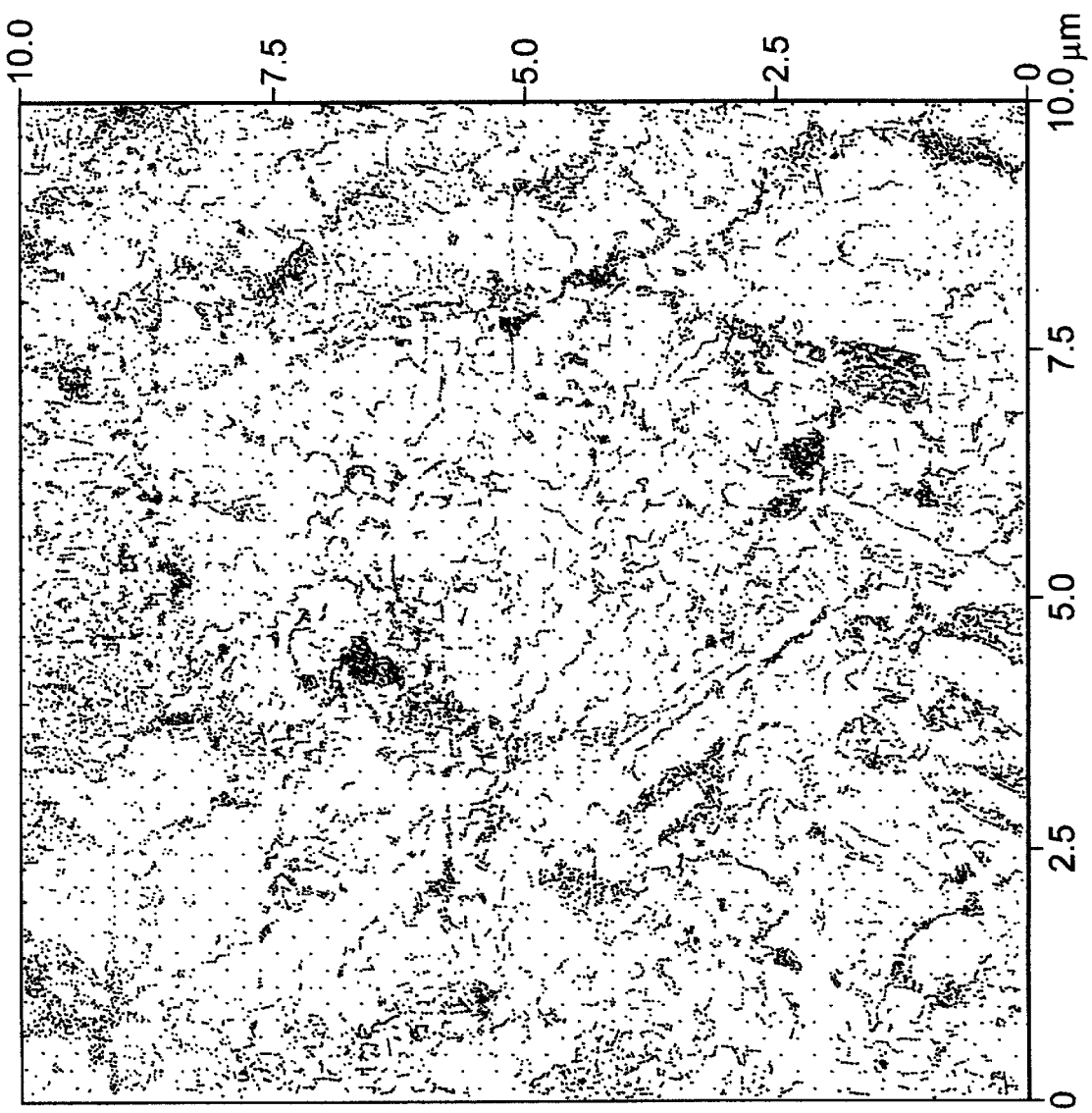
FIG. 3 is an atomic force microscopy (AFM) scan at 10 μm×10 μm magnification of a sample of the copper of FIG. 1 cleaned with another composition according to the present invention.
Figure 4:
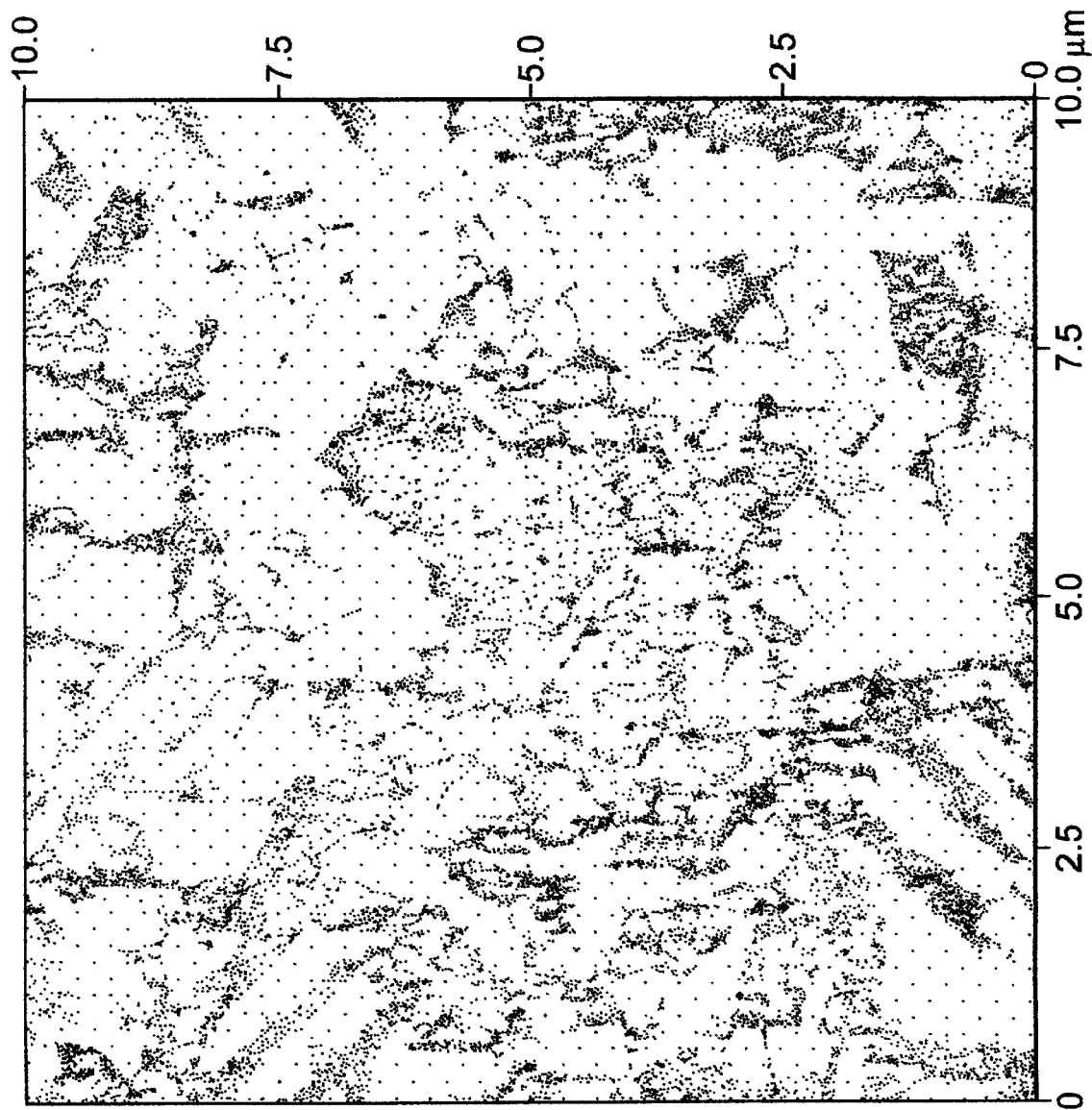
FIG. 4 is an atomic force microscopy (AFM) scan at 10 μm×10 μm magnification of a copper sample of FIG. 1 treated with a different composition according to the present invention.

Examples of AFM scans with RMS roughness data are shown in FIGS. 1–4 wherein FIG. 1 is the untreated electrochemically deposited (ECD) copper wafer, FIG. 2 is an identical ECD copper wafer exposed to solution A, FIG. 3 is an ECD copper wafer exposed to solution B and FIG. 4 is an ECD copper wafer exposed to a solution consisting of 0.9 wt % MEA, 0.5 wt % TMAH, 0.18 wt % gallic acid, balance water.

EXAMPLE 3

A series of cleaning solutions were prepared to evaluate the relationship between TMAH, MEA, and ascorbic acid in aqueous cleaning solutions. Cleaning solutions were prepared by using various combinations of TMAH, MEA, and ascorbic acid, and deionized water such that the concentration of TMAH varied from 0.0 wt % to 0.5 wt %; the concentration of MEA varied from 0 wt % to 0.9 wt %; the concentration of ascorbic acid varied from 0 wt % to 0.35 wt %; with the balance of the solution being deionized water. The test solutions were prepared as set forth in Table III. The prepared cleaning solutions were evaluated for cleaning performance according to the glass slide dip test procedure set forth in Example 1. The prepared cleaning solutions were also evaluated for tendency to corrode copper according to the copper strip, test procedure of Example 2.

TABLE III

| Composition | A | B | C | D | E | F | G |
|---|---|---|---|---|---|---|---|
| TMAH (Weight %) | 0.5 | X | X | 0.5 | 0.5 | X | 0.5 |
| MEA (Weight %) | 0 | 0.9 | X | 0.9 | X | 0.9 | 0.9 |
| Ascorbic Acid (Weight %) | X | X | 0.35 | X | 0.35 | 0.35 | 0.35 |
| Water (Weight %) | 99.50 | 99.10 | 99.65 | 98.60 | 99.15 | 98.75 | 98.25 |
| Composition Alkalinity | 0.055 | 0.147 | −0.020 | 0.202 | 0.035 | 0.127 | 0.182 |

TABLE III-continued

| Composition | A | B | C | D | E | F | G |
|---|---|---|---|---|---|---|---|
| Meq./gram of solution | | | | | | | |
| Dip Test Rating* | 3 | 5 | 5 | 3 | 5 | 5 | 1 |

*1 = good, 3 = fair, and 5 = poor

The results indicate that the solutions that performed best as cleaning agents in the dip test (Composition G) contained TMAH, MEA, and ascorbic acid. Solutions not containing at least one of these constituents did not perform as well. The results suggest a synergistic cleaning effect is present when TMAH, MEA, and ascorbic acid co-exist in a cleaning solution, particularly in the preferred amounts.

EXAMPLE 4

Figure 5:
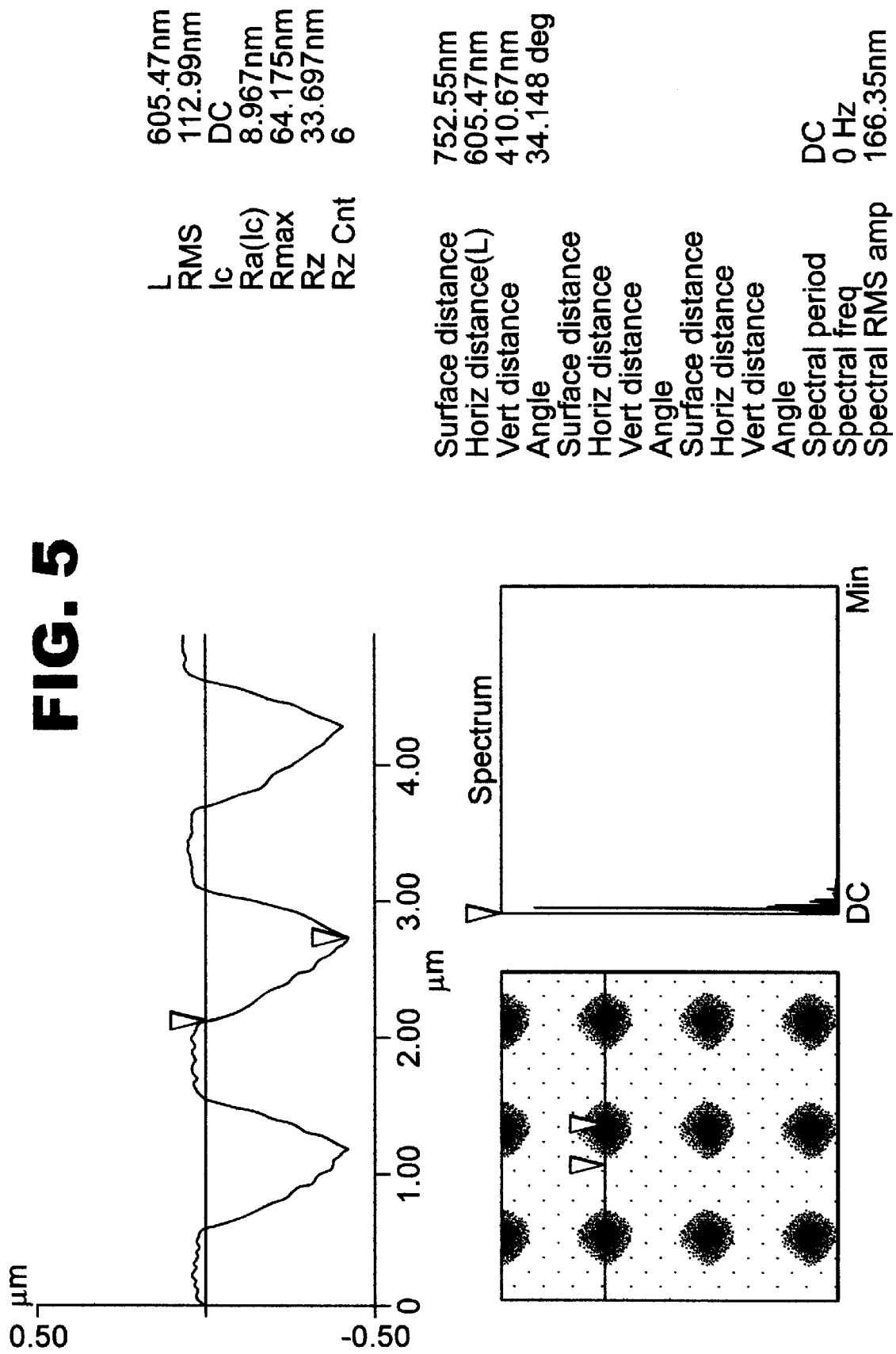
FIG. 5 is an atomic force microscopy (AFM) scan at 10 μm×10 μm magnification of a via prior to treatment with compositions according to the present invention.

FIG. 5 shows an AFM sectional analysis of the 1 micron size via on the original wafer surface. The depth profile of the via is about 400 nm. A cross-sectional examination of these vias clearly indicates that a significant amount of the polymer residue is left after the etching.

A cleaning solution according to the invention was prepared having composition of 10.0 wt % TMAH, 18.0 wt % MEA, 7.0 wt % ascorbic acid, balance water. A partially etched via wafer was immersed in this solution at 70° C. for 30 minutes. It was then rinsed with DI water for about 1 minute, followed by $N_2$ blow dry.

Figure 6:
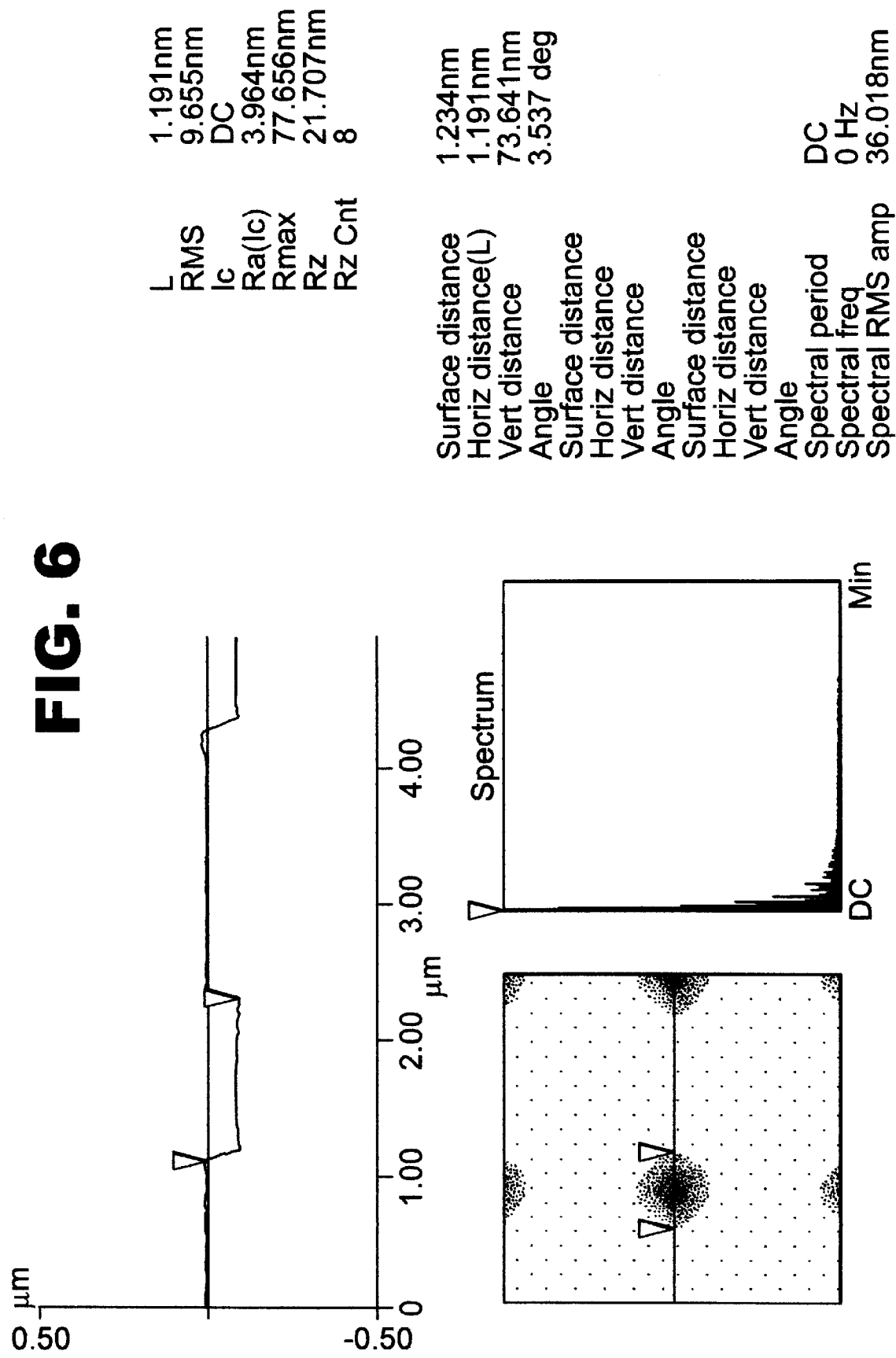
FIG. 6 is an atomic force microscopy (AFM) scan at 10 μm×10 μm magnification of the via of FIG. 5 after treatment with a solution according to the present invention.
Figure 7A:
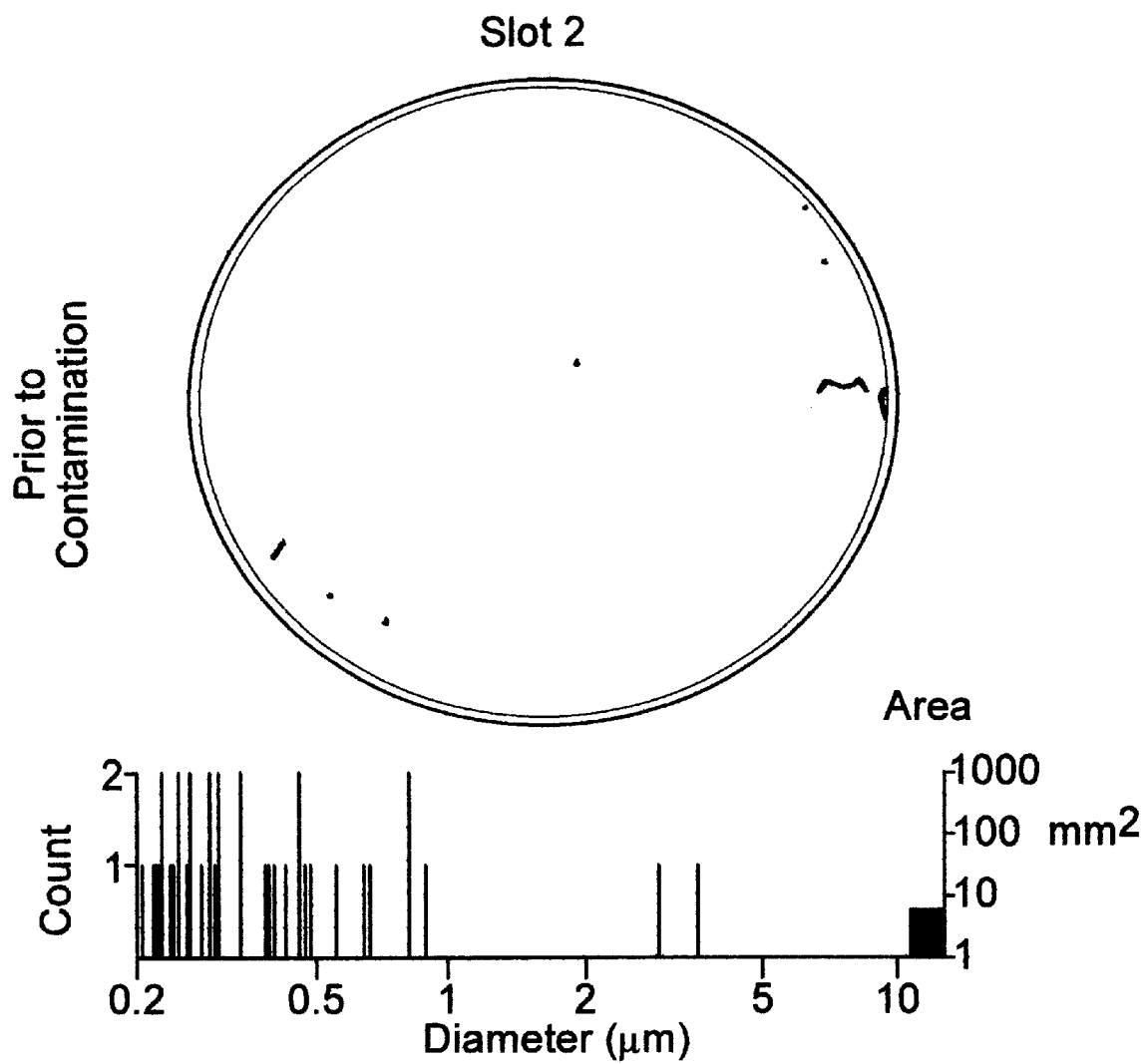
FIGS. 7A through 7D are representations of data illustrating particle count measurement on wafers before and after cleaning with a composition according to the present invention.
Figure 7B:
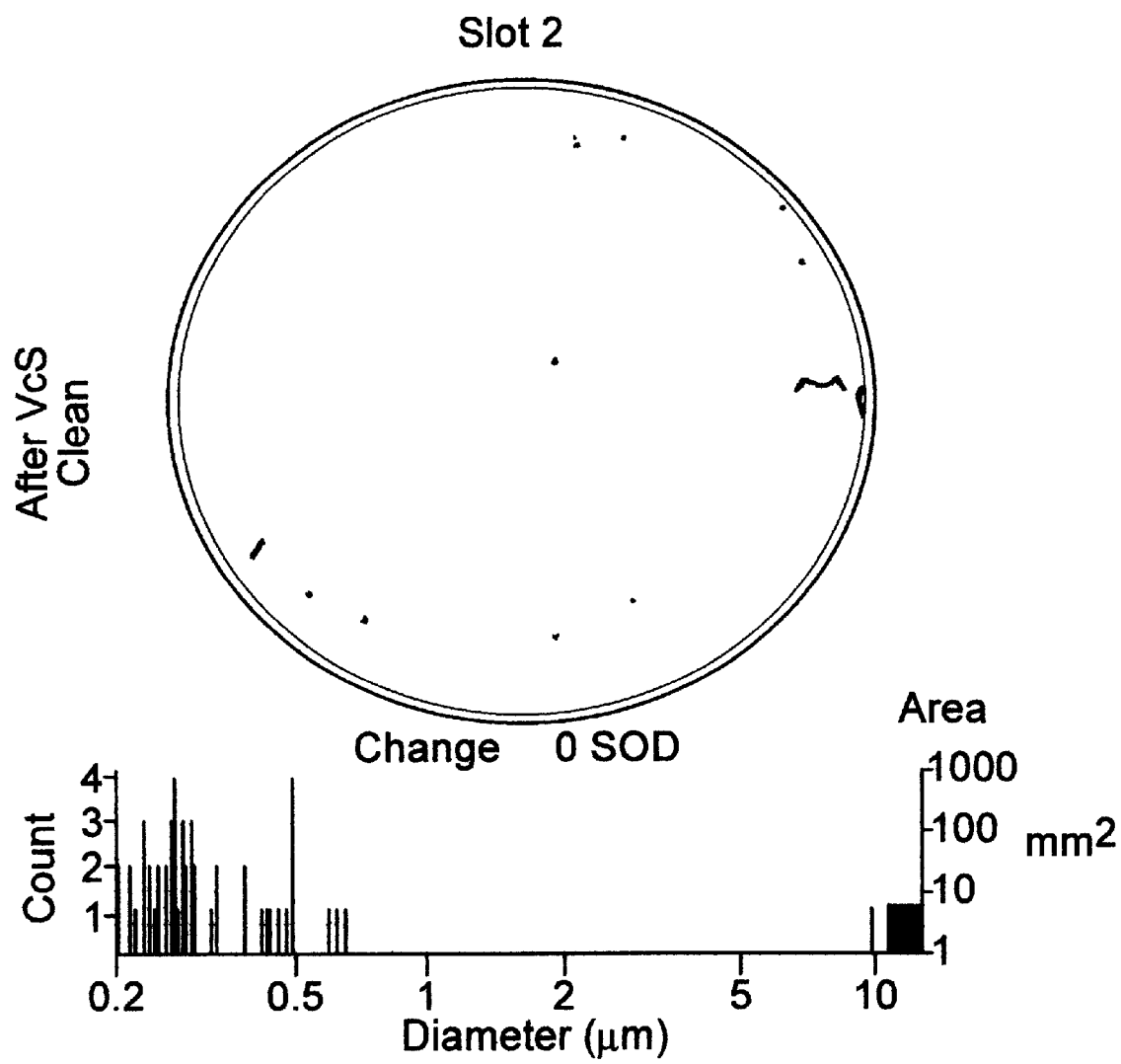
Figure 7C:
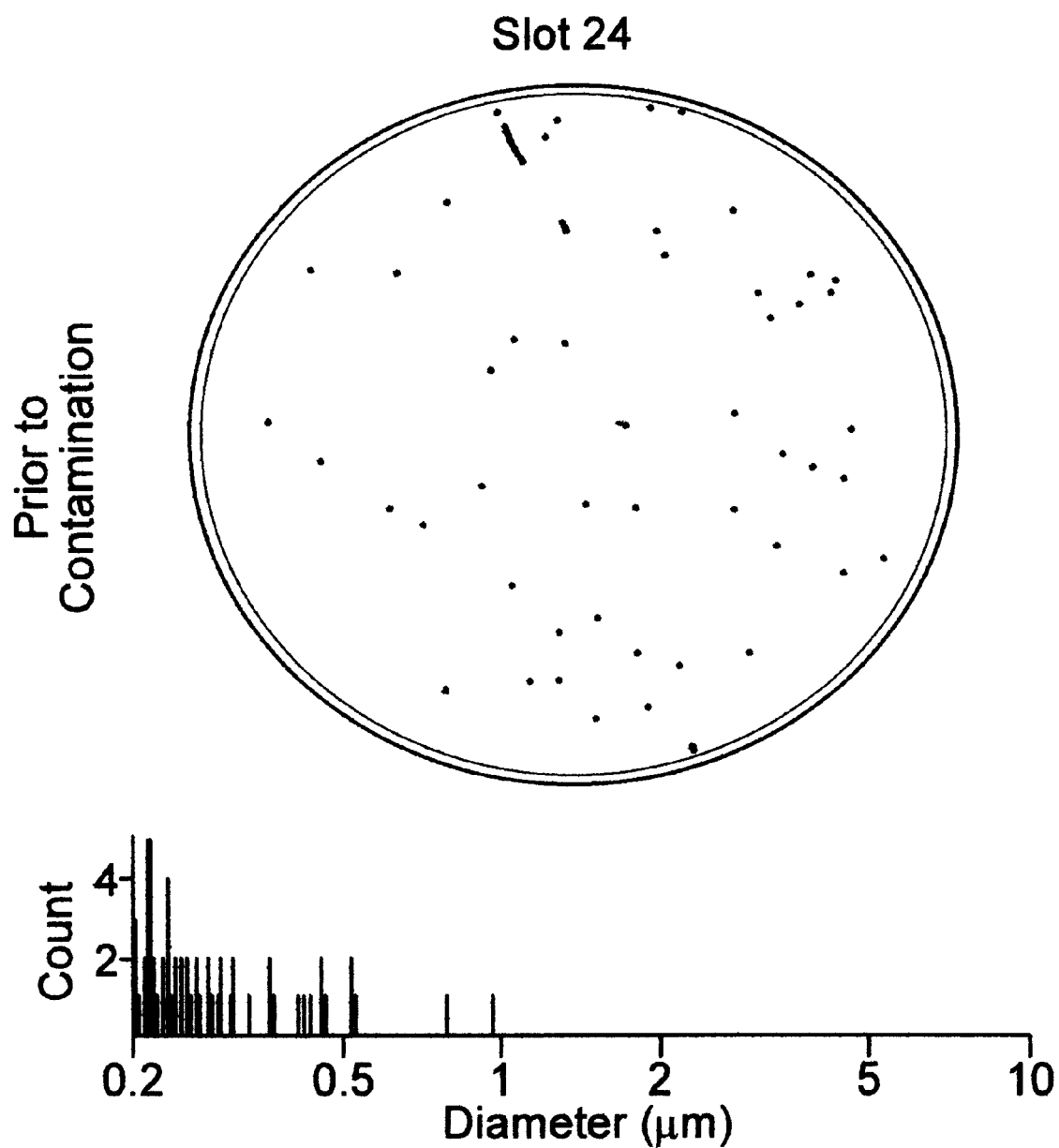
Figure 7D:
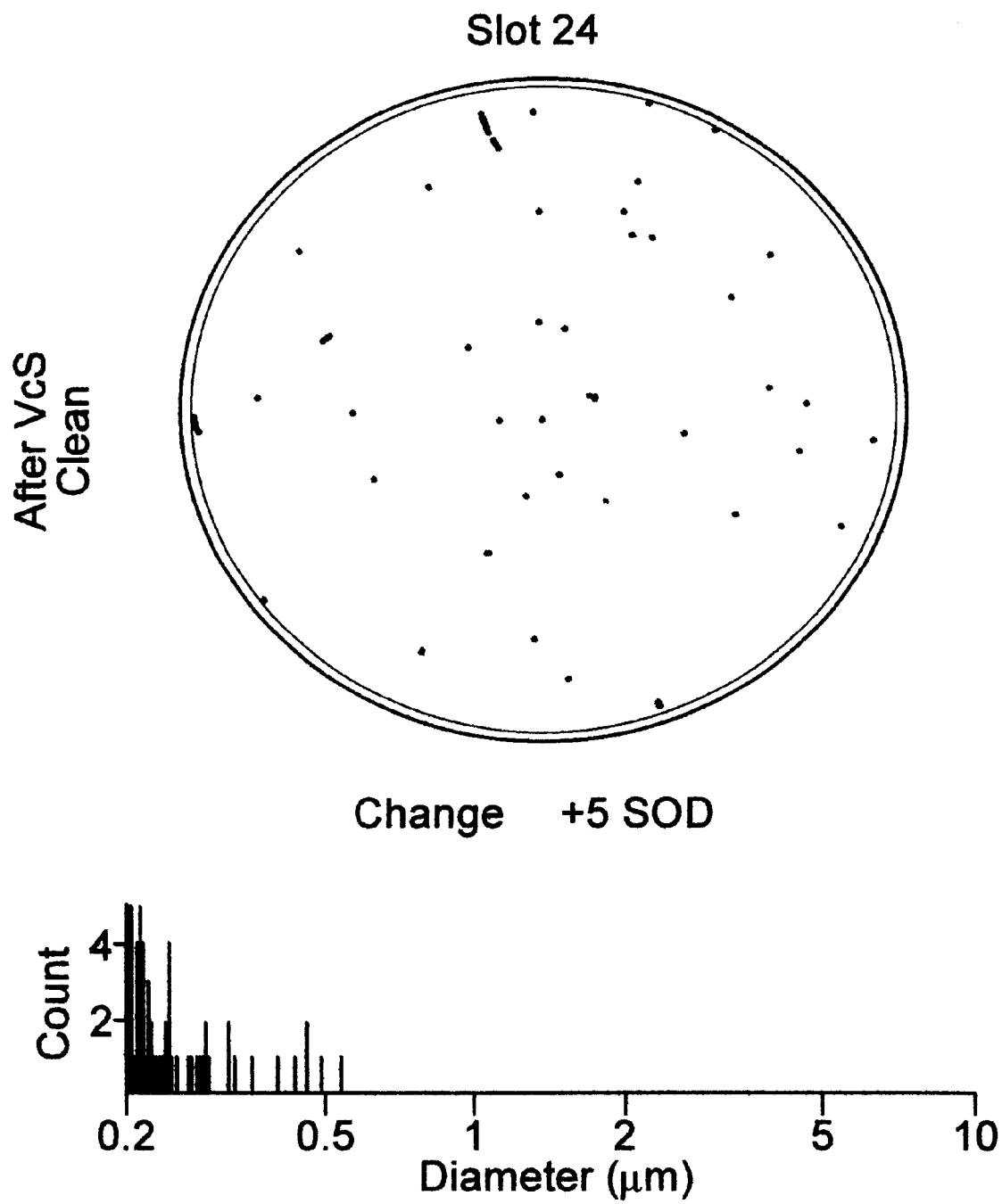
Figure 8A:
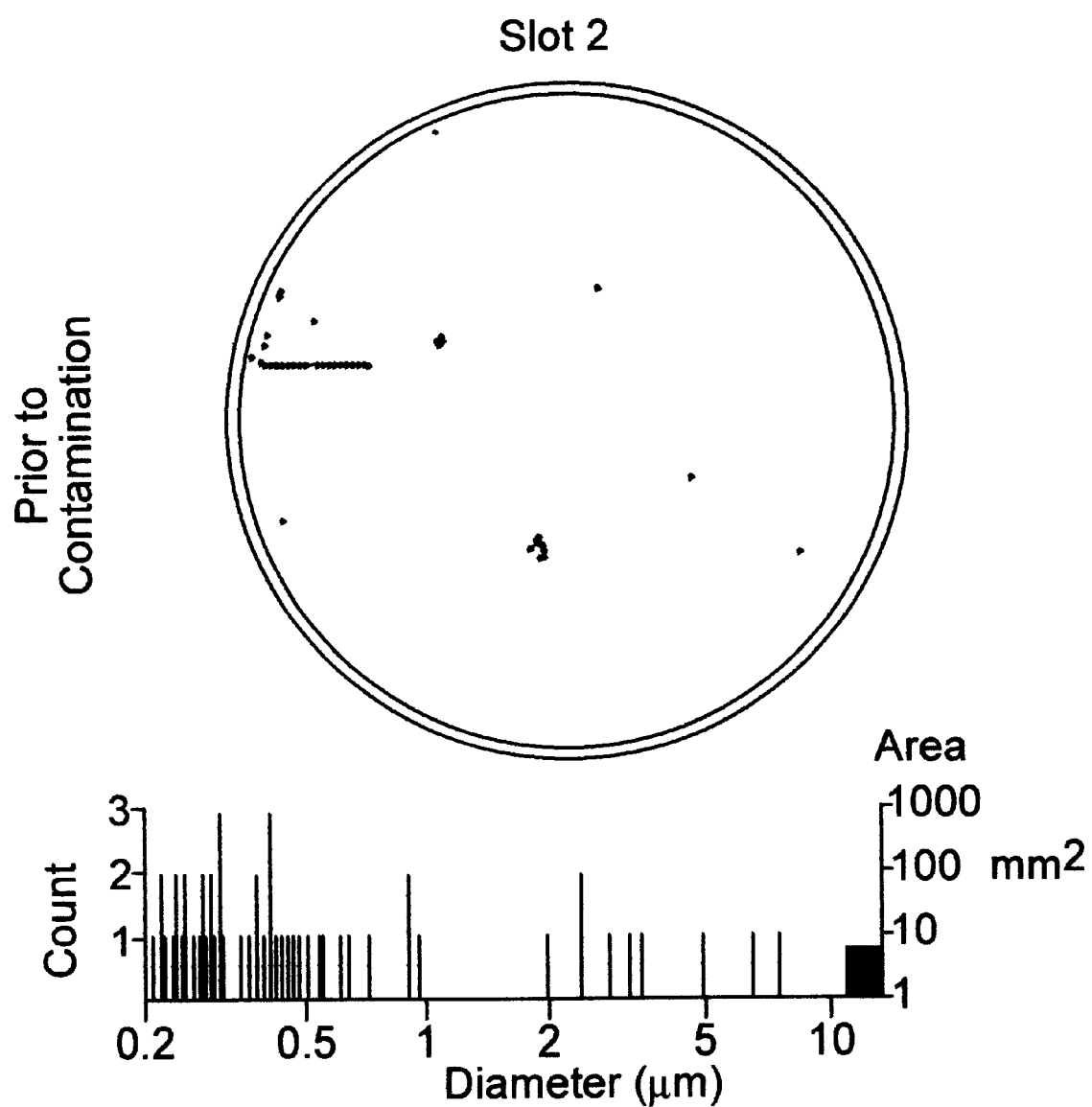
FIGS. 8A through 8D are particle count scans of a wafer prior to and after cleaning with a solution according to the present invention.
Figure 8B:
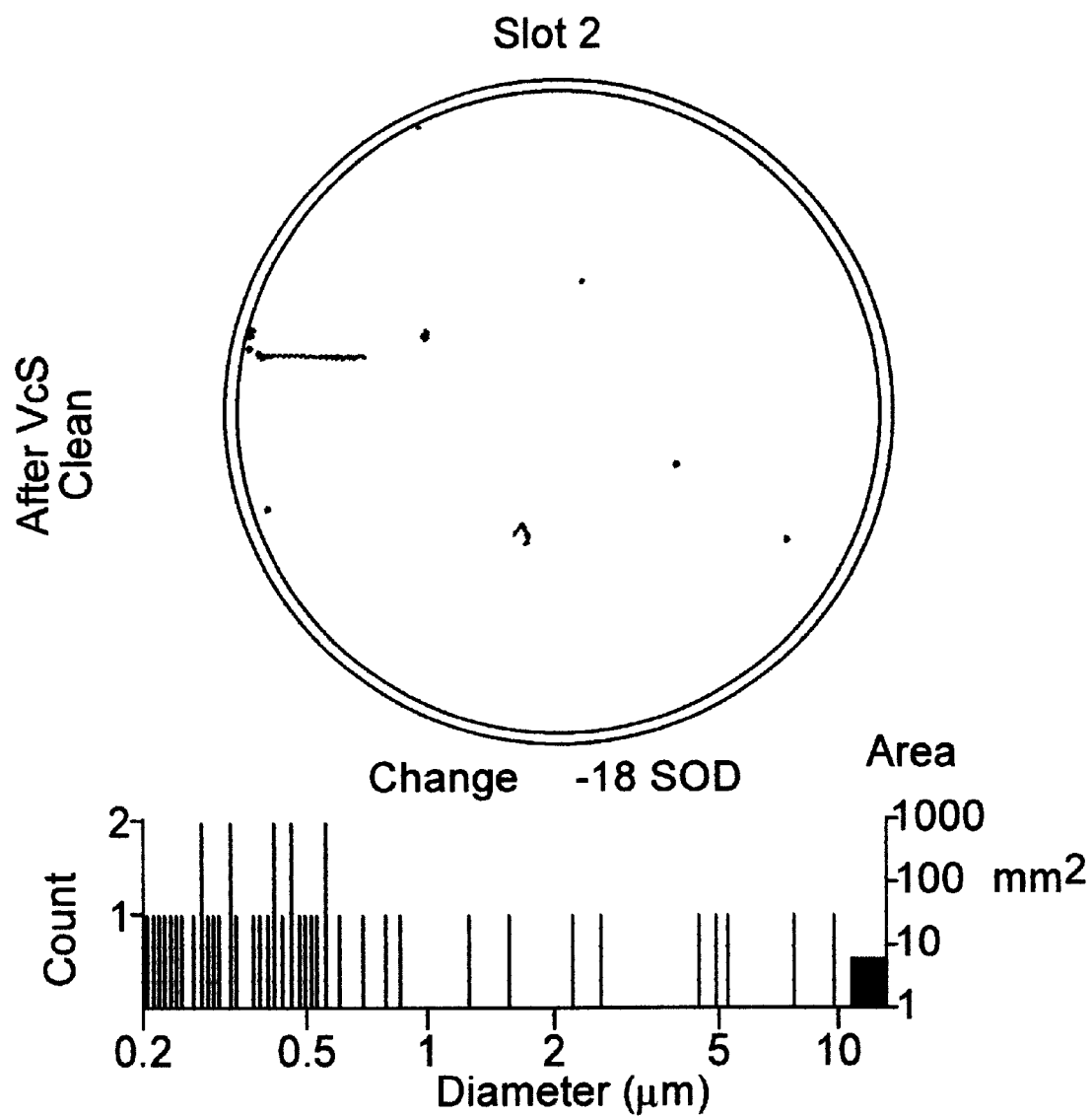
Figure 8C:
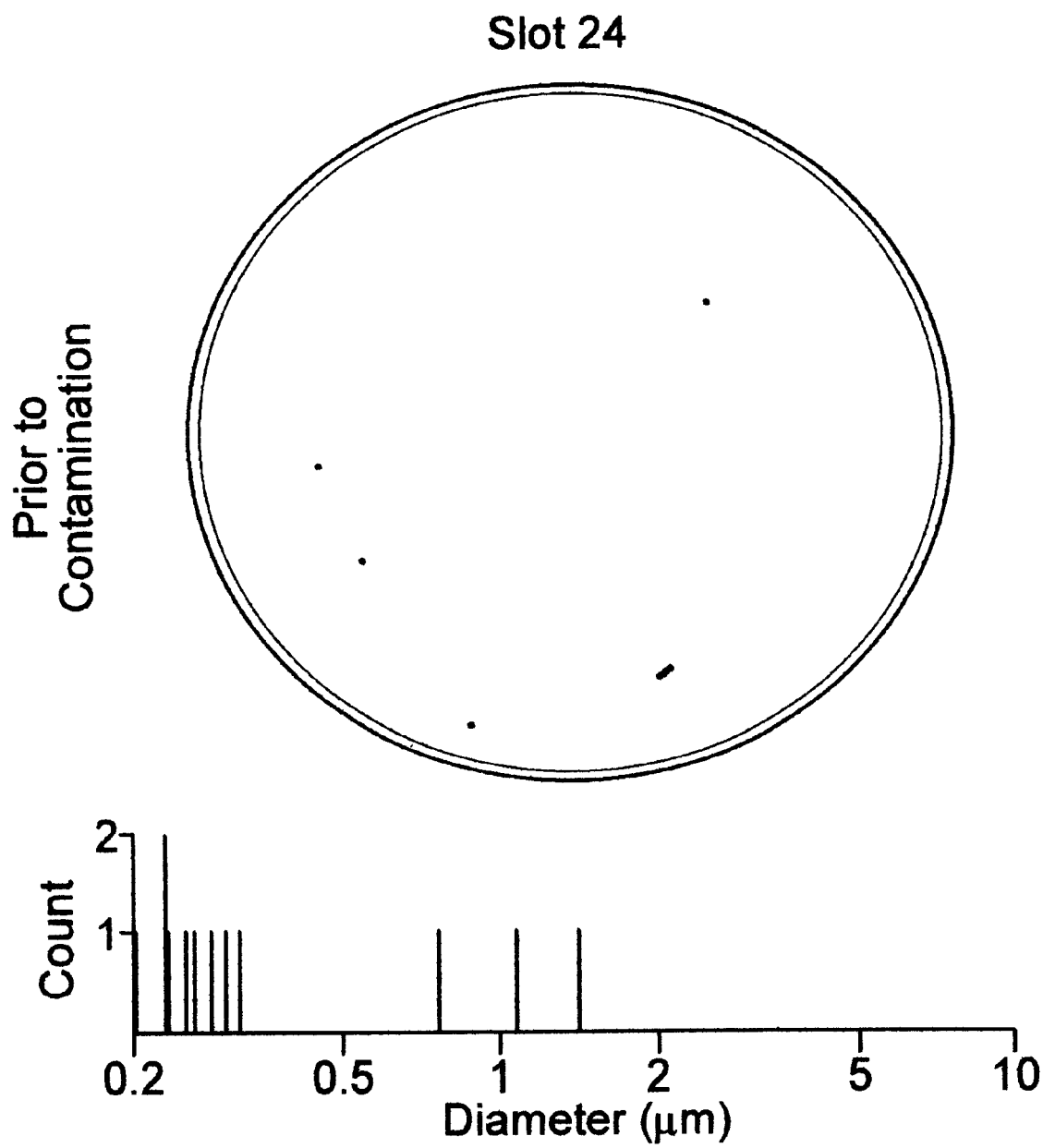
Figure 8D:
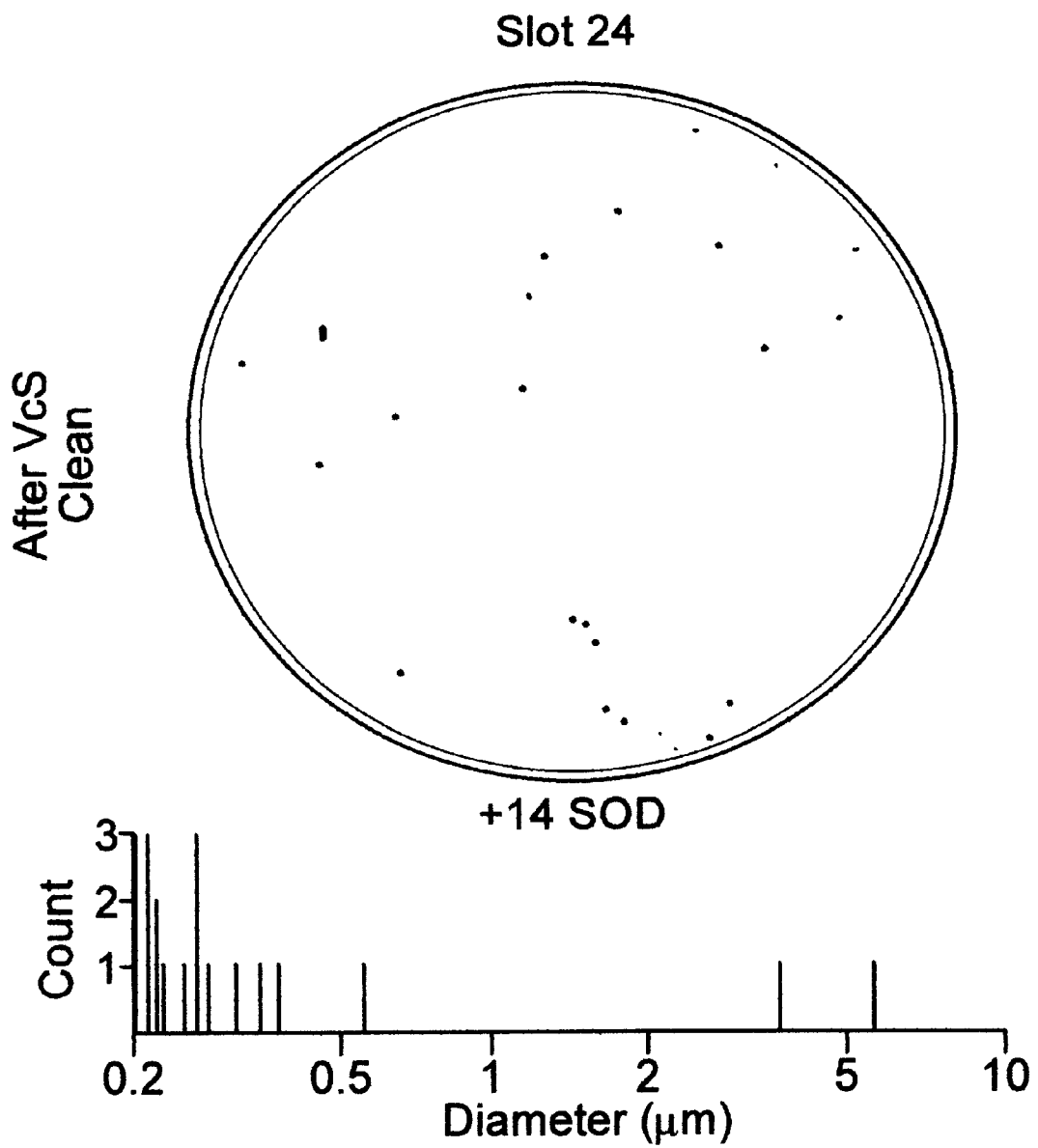

FIG. 6 shows the AFM sectional analysis of the same type of 1 micron size vias after treatment with the above solution. Cross-sectional views of these via reveals that they have a very shallow depth profile (on the average 80 nm). The contrast of the depth profile of the via before and after treatment is due to the removal of the photoresist layer from the wafer surface, which is estimated to be about 300 nm thick. The rectangular profile of via bottom (FIG. 6) also indicates that the sidewall polymer was removed by the above solution. These results suggest that the preferred embodiment is an useful composition for via cleaning and photoresist stripping.

EXAMPLE 5

Two solutions were tested for post CMP cleaning application. Solution 1 (0.45 wt % MEA, 0.25 wt % TMAH and 0.175 wt % gallic acid and the balance water) and Solution 11 (0.45 wt % MEA, 0.25 wt % TMAH and 0.175 wt % ascorbic acid and the balance water) were used for a cleaning test using a Cobra-VcS station on TEOS wafers prior to, and after dipping in Olin Arch 10K slurry solution. FIGS. 7A through 7D and 8A through 8D show the particle counts measured using a KLA-Tencor instrument from wafers cleaned with Solution I and Solution II. It is clear, that Solution II, a preferred composition according to the invention, demonstrates a superior cleaning capability.

EXAMPLE 6

Concentrate solutions diluted to 1.25, 1.33, 2.5, and 5 wt % respectively were prepared and evaluated. A partially planarized ECD copper wafer piece was submersed in these stirred solutions for 30 minutes at two different constant temperature conditions (22° C. and 50° C.). Four point probe measurements for sheet resistance were made on these pieces prior to and after these treatments. Copper etch rates for the solutions were calculated. Concentrate A is 10.0 wt % TMAH, 18 wt % MEA, 7.0 wt % ascorbic acid, and the balance water. Concentrate B is 10.0 wt % TMAH, 18 wt % MEA, 7.0 wt % gallic acid, and the balance water. Results are reported in angstroms per minute are set forth in Table IV.

TABLE IV

| | Concentrate Composition A | | Concentrate Composition B | |
|---|---|---|---|---|
| Concentrate wt % | Etch Rate At 22° C. | Etch Rate At 50° C. | Etch Rate At 22° C. | Etch Rate At 50° C. |
| 1.25 | 4.52 | 23.35 | 22.05 | 88.39 |
| 1.665 | 9.24 | 23.58 | 19.66 | 118.91 |
| 2.5 | 0.55 | 24.68 | 28.86 | 161.39 |
| 5 | 0.00 | 13.91 | 27.82 | 234.20 |

It is clear from the data in Table IV that concentrate composition A has superior corrosion inhibition properties to that of concentrate composition B.

EXAMPLE 7

Two concentrate solutions were made in the manner of Example 6 and diluted to 12.5 and 50 wt % respectively. A partially planarized ECD copper wafer piece was submersed in these stirred solutions for 10 minutes at constant temperature (22° C.). Four point probe measurements for sheet resistance were made on these pieces prior to and after these treatments. Sheet resistance changes are reported in milliohms per centimeter squared in Table V.

TABLE V

| | Sheet Resistance Change | |
|---|---|---|
| Concentrate wt % | Concentrate Composition A | Concentrate Composition B |
| 12.5 | −0.0015 | 0.1742 |
| 50 | −0.0994 | 0.3307 |

It is clear that concentrate composition A has superior corrosion inhibition properties to that of concentrate composition B. Concentrate composition A also clearly demonstrates an unexpected result in that there is a decrease in sheet resistance.

Having thus described our invention, which is not limited to the particular embodiments shown and described herein, what is desired to be secured by Letters Patent of the United States is set forth in the appended claims.

What is claimed:

1. A cleaning solution for cleaning a copper-containing integrated circuit after chemical-mechanical polishing during manufacturing of said integrated circuit the cleaning solution comprising:

0.05 to 12.4 wt % quaternary ammonium hydroxide selected from the group consisting of tetraalkylammonium hydroxide, wherein the alkyl contains one of $C_1$ through $C_{10}$ atoms or combination of $C_1$ through $C_{10}$ atoms;

0.2 wt % to 27.8 wt % of a polar organic amine selected from the group consisting of monoethanolamine, aminoethylethanolamine, N-methylaminoethanol, aminoethoxyethanol, diethanolamine, triethanolamine, $C_2$–$C_5$ alkanolamines, and combinations thereof;

0.1 to 10.9 wt % of a corrosion inhibitor selected from the group consisting of ascorbic acid (Vitamin C), L(+)- ascorbic acid, isoascorbic acid, ascorbic acid derivatives, and combinations thereof, balance water; and wherein the alkalinity of the solution is greater than 0.073 milliequivalents base per gram of solution.

2. A cleaning solution for cleaning copper-containing microelectronic substrates, the cleaning solution comprising:

0.5 to 12.4 wt % tetramethylammonium hydroxide;

0.2 to 27.8 wt % monoethanolamine;

0.2 to 10.9 wt % ascorbic acid balance deionized water; and wherein the alkalinity of the solution is greater than 0.073 milliequivalents base per gram of solution.

3. A cleaning solution according to claim 2, wherein the alkalinity of the solution is greater than about 0.1 milliequivalents base per gram of solution.

4. A cleaning solution for CMP cleaning, consisting essentially of 0.05 wt % to 1.25 wt % tetramethylammonium hydroxide 0.2 wt % to 2.25 wt % monoethanolamine and 0.2 wt % to 10.9 wt % ascorbic acid, balance water.

5. A via cleaning solution consisting essentially of 7.5 wt % to 12.4 wt % tetramethylammonium hydroxide 12.5 wt % to 27.8 wt % monoethanolamine 0.2 wt % to 10.9 wt % ascorbic acid, balance water.

6. A cleaning solution for cleaning a copper-containing integrated circuit after chemical-mechanical polishing during the manufacture of said integrated circuit, the cleaning solution consisting essentially of;

from 1.5 wt % to 12.5 wt % of a concentrate consisting of 3.0 to 12.4 wt % quaternary ammonium hydroxide selected from the group consisting of tetraalkylammonium hydroxide wherein the alkyl contains one of $C_1$ through $C_{10}$ atoms or combination of $C_1$ through $C_{10}$ atoms, 5.0 wt % to 27.8 wt % of a polar organic amine selected from the group consisting of monoethanolamine, aminoethylethanolamine, N-methylaminoethanol, aminoethoxyethanol, diethanolamine, triethanolamine, $C_2$-$C_5$ alkanolamines, and mixture thereof; 0.1 wt % to 10.9 wt % corrosion inhibitor selected from the group consisting of ascorbic acid (Vitamin C), L(+)-ascorbic acid, isoascorbic acid, ascorbic acid derivatives, and combinations thereof balance water; and, 87.5 wt % to 98.5 wt % deionized water, with the solution having an alkalinity greater than 0.073 milliequivalents base per gram of solution.

7. A cleaning solution for copper-containing microelectronic substrate, tie cleaning solution consisting essentially of;

from 1.5 wt % to 12.5 wt % of a concentrate consisting of from 5.0 to 12.4% by wt tetramethylammonium hydroxide, 2.0 to 27.8 wt % by wt monoethanolamine, 2.0 to 10.9% by wt ascorbic acid, balance water; and 87.5 wt % to 98.5% by wt deionized water, the solution having a alkalinity greater than 0.073 milliequivalents base per gram of solution.

* * * * *

UNITED STATES PATENT AND TRADEMARK OFFICE
CERTIFICATE OF CORRECTION

PATENT NO. : 6,492,308 B1
DATED : December 10, 2002
INVENTOR(S) : Naghshineh et al.

It is certified that error appears in the above-identified patent and that said Letters Patent is hereby corrected as shown below:

Title page,
Item [56], References Cited, U.S. PATENT DOCUMENTS, "6,194,366", delete "Nagashineh" and insert -- Naghshineh --.

Column 6,
Line 49, delete "$NH_{40}H:H_2O_2:H_2O$" and insert -- $NH_4OH:H_2O_2:H_2O$ --.

Column 7,
Line 29, after "to" insert -- corrode --.
Line 30, after 0.35" insert -- wt% (L)- --.

Column 8,
Line 57, insert -- The results are shown in Table III. --.

Column 12,
Line 20, delete "tie" and insert -- the --.

Signed and Sealed this

Twenty-sixth Day of August, 2003

JAMES E. ROGAN
*Director of the United States Patent and Trademark Office*